United States Patent
Kermorvant et al.

(10) Patent No.: US 10,408,867 B2
(45) Date of Patent: Sep. 10, 2019

(54) ANALOG SPECTRUM ANALYZER

(71) Applicants: THALES, Courbevoie (FR); CENTRE NATIONAL DE LA RECHERCHE SCIENTIFIQUE, Paris (FR)

(72) Inventors: Julien Kermorvant, Gennevilliers (FR); Paolo Bortolotti, Palaiseau (FR); Bruno Marcilhac, Palaiseau (FR); Jean-Claude Mage, Palaiseau (FR); Vincent Cros, Palaiseau (FR)

(73) Assignees: THALES, Courbevoie (FR); CENTRE NATIONAL DE LA RECHERCHE SCIENTIFIQUE, Paris (FR)

(*) Notice: Subject to any disclaimer, the term of this patent is extended or adjusted under 35 U.S.C. 154(b) by 59 days.

(21) Appl. No.: 15/101,359

(22) PCT Filed: Dec. 4, 2014

(86) PCT No.: PCT/EP2014/076576
§ 371 (c)(1),
(2) Date: Jun. 2, 2016

(87) PCT Pub. No.: WO2015/082618
PCT Pub. Date: Jun. 11, 2015

(65) Prior Publication Data
US 2016/0305994 A1    Oct. 20, 2016

(30) Foreign Application Priority Data
Dec. 4, 2013 (FR) .................................. 13 02819

(51) Int. Cl.
*G01R 23/163* (2006.01)
*G01R 23/165* (2006.01)

(52) U.S. Cl.
CPC ......... *G01R 23/163* (2013.01); *G01R 23/165* (2013.01)

(58) Field of Classification Search
CPC ............................ G01R 23/163; G01R 23/165
See application file for complete search history.

(56) References Cited

U.S. PATENT DOCUMENTS

| 6,392,397 B1* | 5/2002 | Thomas | G01R 23/165 |
| | | | 324/76.11 |
| 2007/0024277 A1* | 2/2007 | Cech | G01D 5/2013 |
| | | | 324/239 |

(Continued)

FOREIGN PATENT DOCUMENTS

| EP | 2 515 130 A1 | 10/2012 |
| FR | 2 942 924 A1 | 9/2010 |

(Continued)

OTHER PUBLICATIONS

N. Locatelli et al., "Dynamics of two coupled vortices in a spin valve nanopillar excited by spin transfer torque," Applied Physics Letters, vol. 98, No. 6, Feb. 7, 2011, pp. 62501-62501, XP012139441.

*Primary Examiner* — Akm Zakaria
(74) *Attorney, Agent, or Firm* — Baker & Hostetler LLP

(57) ABSTRACT

A spectrum analyzer for a signal $I_{RF}$ comprising a plurality of frequencies $f_i$ comprises N entities each made up of a structure formed by a stack of magnetic and non-magnetic layers having in at least one of the magnetic layers a magnetic configuration in the shape of a vortex, the excitation modes of the magnetic configuration being suitable for detecting the frequencies contained in an incident signal in real time, each entity having a first lower electrode and a second upper electrode, a voltage-measuring device suitable for measuring an electric voltage showing the presence of a frequency $f_k$ in the analyzed signal $I_{RF}$, the device being connected to the lower electrode and to the upper electrode, a measurement-processing device suitable for determining (Continued)

the value of the frequencies $f_k$ in the signal $I_{RF}$, and a line carrying the signal to be analyzed to each of the entities.

12 Claims, 5 Drawing Sheets

(56) References Cited

U.S. PATENT DOCUMENTS

| | | |
|---|---|---|
| 2008/0150643 A1 | 6/2008 | Suzuki et al. |
| 2008/0180085 A1 | 7/2008 | Koga et al. |
| 2009/0140733 A1* | 6/2009 | Koga .................. B82Y 25/00 324/252 |
| 2013/0099339 A1 | 4/2013 | Meitzler et al. |
| 2014/0218122 A1* | 8/2014 | Locatelli .............. H03B 15/006 331/94.1 |

FOREIGN PATENT DOCUMENTS

| | | |
|---|---|---|
| WO | 2006/101040 A1 | 9/2006 |
| WO | 2013/007797 A1 | 1/2013 |

* cited by examiner

US 10,408,867 B2

ANALOG SPECTRUM ANALYZER

CROSS-REFERENCE TO RELATED APPLICATIONS

This application is a National Stage of International patent application PCT/EP2014/076576, filed on Dec. 4, 2014, which claims priority to foreign French patent application No. FR 1302819, filed on Dec. 4, 2013, the disclosures of which are incorporated by reference in their entirety.

FIELD OF THE INVENTION

The subject of the invention relates to an integrated radiofrequency signal spectral analyzer. It notably makes it possible to instantaneously or quasi-instantaneously know the frequencies present in a signal $I_{RF}$. The analyzer can be used to know the availability or the occupancy of a frequency or of a band of frequencies over a given frequency spectrum. The invention applies for ranges of frequencies ranging from a few tens of MHz to a few GHz for example.

BACKGROUND

The current radiocommunication and spectrum monitoring protocols known to the applicant increasingly require a real time knowledge of the state of occupancy of the frequency bands, in order to effectively manage the allocation of the frequency bands for the users and, in the case of unauthorized presence, to be able to locate it. There are currently a number of techniques for performing a spectral analysis of a radiofrequency signal.

A first way of proceeding is to perform a multichannel spectral analysis by using filter banks. This technique presents the notable drawback of being complex to implement over wide bands. A second way of proceeding is to perform an analog spectral analysis by delay line bank. In this case, the digital metering and the standard delay line-based systems operate only in single-frequency mode. The combination of the two systems can be envisaged, but creates complexity and difficulty for the concept to be well controlled. A third alternative is to perform an analog spectral analysis by delay line with multiple taps. Finally, it is also known to use a technique known by the expression "Spectral Hole Burning" which requires cryogenics and which dictates the use of heavy, bulky and costly equipment.

Other techniques developed more recently are based on magnetic stacking structures (for example spin valves or tunnel effect metal junctions), the electrical resistance of which varies by virtue of a rectification effect upon the application of a radiofrequency wave. This characteristic variation is used to perform the real-time detection and/or spectral analysis of a given frequency range. These magnetic structures take the form of a multilayer stacking fabricated in the form of nanopillars, hereinafter "junction". Four examples representative of magnetic structures applied to frequency detection are detailed in the patent applications: WO2006101040, US20130099339, US20080180085 and EP2515130.

Despite their performance levels, the magnetic devices proposed by the prior art allow frequency detection only above 1 GHz and with a modest resolution due to the resonance mode used (resonance mode linked to a quasi-uniform magnetization). In addition, the devices proposed are not compatible with an instantaneous wideband spectral analysis. Indeed, to cover wide bands with a single detection element, it is necessary to apply a variable magnetic field or a variable electrical current over a wide range, the detection then being done by scanning in a non-instantaneous manner. In order to lift this limitation, the patent US 20090140733 proposes a networking of multiple junctions. However, to operate, the device requires the application of a different magnetic field on each pillar. This field is then applied via a structure of "YOKE" type, known to those skilled in the art, making production extremely complex. Furthermore, one of the major benefits from this technology, which is the extreme compactness, is somewhat reduced.

In order to simultaneously address the wide band characteristic, the instantaneousness, the compactness and the detection capacity below 1 GHz, the idea of the present invention relates to a novel approach which relies on the use of a network of magnetic structures exhibiting a specific resonance mode, associated with a non-uniform magnetic configuration. In the case of a vortex magnetization, this resonance mode is the "gyrotropic mode of the vortex core", or more simply "vortex mode", which makes it possible to associate the oscillation frequency of a magnetic structure with its geometry.

SUMMARY OF THE INVENTION

The object of the invention relates to a spectrum analyzer for a signal $I_{RF}$ comprising a plurality of frequencies $f_i$, characterized in that it comprises N entities each consisting of a structure formed by a stacking of magnetic and non-magnetic layers, having, in at least one of the magnetic layers, a vortex-form magnetic configuration, the excitation modes of said magnetic configuration being adapted to detect in real time the frequencies contained in an incident signal, each entity having a bottom first electrode and a top second electrode, a device adapted for measuring a voltage representative of the presence of a frequency $f_k$ in the analyzed signal $I_{RF}$, the voltage measurement device being linked to the bottom electrode and to the top electrode, a measurement processing device adapted for determining the value of the frequencies $f_k$ present in the signal $I_{RF}$, a line bringing the signal to be analyzed to each of the entities.

According to a variant embodiment, the spectrum analyzer is characterized in that said entities are arranged in parallel, a transmission line bringing the signal to be analyzed $I_{RF}$ to a divider adapted for dividing the RF power of the signal to be analyzed and for distributing the signal over N transmission sublines, each subline being connected to a connection circuit linking the top electrode to the voltage measurement device adapted for measuring the value $V_n$ of the voltage between the bottom electrode and the top electrode, the bottom electrode being linked to a ground point common to all the entities and to the voltage measurement device.

According to another variant embodiment, said entities are arranged in series, the first entity is linked to the voltage measurement device and to the injection circuit via a connection circuit, the top electrode is connected to the connection circuit by means of a connection wire, the bottom electrode is linked to the voltage measurement device by means of connection wires, a transmission line brings the signal $I_{RF}$ to the first connection circuit, a nodal point situated on the connection line makes it possible to connect the polarization and measurement circuit to the bottom electrode and to a connection circuit of a next entity, the entity being linked to the voltage measurement device by means of a connection circuit at the level of its top electrode and by a line comprising a nodal point at the level of its bottom electrode, the nodal point being linked with the connection circuit of the next entity, and so on to the last entity.

According to another variant embodiment, the analyzer is characterized in that the entities are arranged in parallel, the top electrode being linked to the voltage measurement device adapted for measuring the value of the voltage $V_n$ between the bottom electrode and the top electrode, the bottom electrode being linked to a ground point common to all the entities, a radiating magnetic line making it possible to inductively couple to the detector the signal to be analyzed $I_{RF}$ at each of the entities.

According to a variant embodiment, the voltage measurement device also consists of N lines making it possible to inject a direct current $I_n$ between the nodal points connected respectively to the bottom electrode and to the top electrode of the entity and making it possible to vary the frequency that the entities are capable of detecting through the measurement of the value of the voltage $V_n$ between the bottom electrode and the top electrode, the node is connected via a first connection wire to a first inductor, in turn connected to a second connection wire via the connection wire, a second node is connected via a second connection wire to a second inductor in turn connected to the connection wire via another connection wire.

The voltage measurement device can also consist of a current source linked by a main connection to a division device adapted for dividing the current and for distributing it over N connection sublines, each subline being connected to a node.

The entities are, for example, devices in the form of pillars having a structure chosen from the following list:
a stacking consisting of: a bottom electrode, a magnetic multilayer of synthetic antiferromagnetic (SAF) type, a non-magnetic intermediate layer, an active layer containing a magnetic vortex and a top electrode,
a stacking consisting of: a bottom electrode, a magnetic multilayer of synthetic antiferromagnetic (SAF) type, a non-magnetic intermediate layer, an active layer containing a magnetic vortex, a second non-magnetic intermediate layer, a perpendicular magnetic polarizer and a top electrode,
a stacking consisting of: a bottom electrode, a first active layer containing a magnetic vortex, a magnetic intermediate layer, a second active layer containing a vortex and a top electrode, and
a stacking consisting of: a bottom electrode, a magnetic multilayer of synthetic antiferromagnetic (SAF) type, a non-magnetic intermediate layer, a first active layer containing a magnetic vortex, a second non-magnetic intermediate layer, a second active layer containing a magnetic vortex and a top electrode.

The analyzer can comprise a voltmeter for measuring the voltage $V_n$ at the terminals of each entity and the processing device consists, for example, of N comparators of the values $V_n$ to a threshold value.

An entity can have an ellipsoidal, square or rectangular form.

The spectrum analyzer can comprise a number of circular entities or junctions having different diameters variable between 50 nm and 1 µm in order to adjust the frequency over a range of frequencies lying typically between 30 MHz and 2 GHz.

According to a variant embodiment, the entities have a structure or a mode of operation adapted for producing a magnetic configuration corresponding to a coreless magnetic vortex, also called C-state.

BRIEF DESCRIPTION OF THE DRAWINGS

Other features and advantages of the method and the device according to the invention will become more apparent on reading the following description of an exemplary embodiment given by way of nonlimiting illustration, with attached figures which represent.

DETAILED DESCRIPTION

Before giving a few examples of embodiments of a spectrum analysis device according to the invention, a recap on the elements used to detect the frequencies present in a frequency spectrum will be given.

Figure 1A:
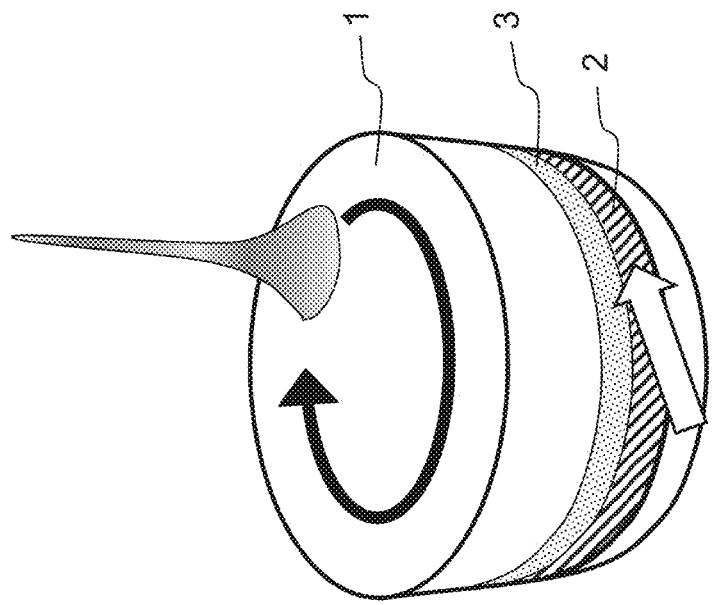
FIGS. 1A and 1B, an illustration of a junction used to implement the invention.
Figure 1B:
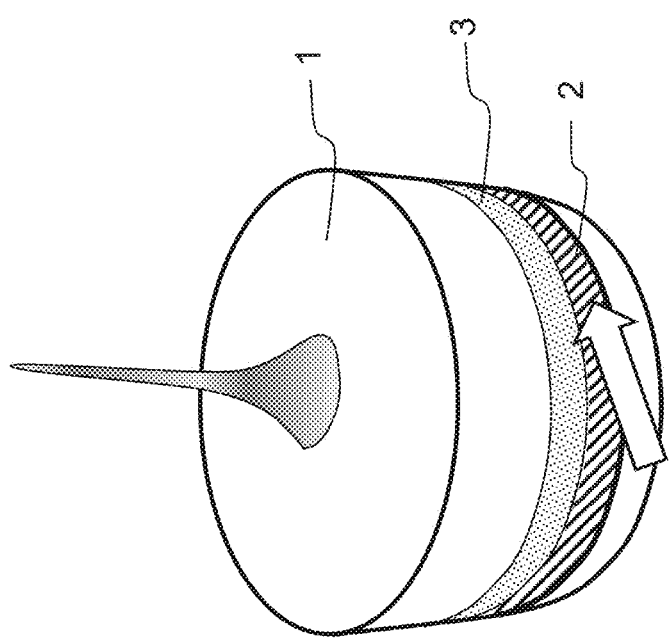

FIGS. 1A and 1B represent an example of a basic building block for the implementation of the invention: a spintronic device having a vortex configuration, i.e. "vortex junction". This junction is constructed from a cylindrical stacking of at least two thin ferromagnetic layers 1, 2 separated by an intermediate layer 3 (that can be metallic or insulating). For simplicity, a circular cylinder is considered. Without departing from the scope of the invention, it is possible to use other forms, for example an elliptical cylinder. For at least one of the two magnetic layers, called "active layer" corresponding to the top layer 1 of FIG. 1, the fundamental state or remanent magnetic configuration is characterized by a non-uniform magnetization, for example a "vortex configuration" or a "C-state" configuration, known to those skilled in the art. A detailed description of the magnetic vortex and also of the terminology used for this field are described in the patent application WO201307797. The thickness of the active layer is denoted h and its diameter $\phi$. In a first configuration, the second magnetic layer, the bottom layer 2, is called "trapped", and is characterized by a uniform magnetization.

The materials envisaged for the production of the magnetic layers 1 and 2 can be, for example, iron Fe, cobalt Co, nickel Ni, alloys comprising at least one of these elements (CoFeB for example) and also Heusler alloys. The thickness of each layer can vary between 0.5 and 40 nm.

Turning now to the intermediate layer, it is possible to envisage, for example, insulating materials such as MgO with a thickness of approximately 1 nm, or else metallic layers such as gold Au or copper Cu, or ruthenium Ru, the thicknesses of which can vary from 1 to 10 nm.

Each layer can consist of a stacking of sublayers in order to improve the magnetic characteristics of the object concerned. For example, the trapped layer can be a so-called synthetic antiferromagnetic (SAF) layer, i.e. formed by a stacking of an antiferromagnetic layer of IrMn or of PtMn of 10 nm, a layer of ferromagnetic materials in direct contact with the antiferromagnetic layer, 2.5 nm of CoFeB for example, and a last magnetic layer, for example 3 nm of CoFeB, separated by a layer of non-magnetic materials, 0.85 nm of Ru for example.

It is also possible to improve the magneto-resistive properties of the tunnel barrier defined by the intermediate layer by inserting magnetic sublayers such as CoFe of approximately 1 nm between the intermediate layer and the active layer.

This junction also comprises, on each of its faces, so-called electrical contact layers (top and bottom electrodes), not represented in FIG. 1, that make it possible to electrically connect the junction to a current or voltage source in order to make a current of electrons circulate through the junction and/or an electrical voltage measurement device such as, for example, a voltmeter or an ammeter.

The structure of the analyzer can comprise a number of entities ($20_n$) in the form of pillars having a structure chosen from the following list:
- a stacking consisting of: a bottom electrode, a magnetic multilayer of synthetic antiferromagnetic (SAF) type, a non-magnetic intermediate layer, an active layer containing a magnetic vortex and a top electrode,
- a stacking consisting of: a bottom electrode, a magnetic multilayer of synthetic antiferromagnetic (SAF) type, a non-magnetic intermediate layer, an active layer containing a magnetic vortex, a second non-magnetic intermediate layer, a perpendicular magnetic polarizer and a top electrode,
- a stacking consisting of: a bottom electrode, a first active layer containing a magnetic vortex, a magnetic intermediate layer, a second active layer containing a vortex and a top electrode, and
- a stacking consisting of: a bottom electrode, a magnetic multilayer of synthetic antiferromagnetic (SAF) type, a non-magnetic intermediate layer, a first active layer containing a magnetic vortex, a second non-magnetic intermediate layer, a second active layer containing a magnetic vortex and a top electrode.

A nonlimiting example of materials that can be used to produce the electrodes can be as follows: the top electrode is formed by 7 nm of Ta, 6 nm of Ru, 5 nm of Cr and 200 nm of Au, the bottom electrode is formed from 3 nm of Ta and 2 nm of Ru. The electrodes are obtained by a number of micro/nano fabrication steps according to a technique known by those skilled in the art and described for example in the patent application US20080150643.

An important geometrical parameter for defining the radiofrequency properties of the junction is its diameter; it can vary, for example, between a few tens of nanometers and a few microns, while the overall thickness can be of the order of some tens of nanometers. In general, all the layers of the junction (except for the electrodes) have the same diameter $\phi$ as that of the active layer. There can however be variants in which the diameter of the junction is not constant over its entire height.

Typically, the junction is deposited on a substrate, for example of $SiO_2$ type.

If no external force acts on the active layer, the vortex is stable in its position of equilibrium (generally at the disk center, FIG. 1A). If a spin-polarized electrical current is injected through the junction, by virtue of the spin transfer phenomenon, the core of the magnetic vortex can be gyrated about its position of equilibrium (FIG. 1B). The gyration frequency is determined by the geometrical parameters and by the materials used. For example, if a circular layer of NiFe with a diameter of 500 nm and a thickness of 5 nm is considered, the gyration frequency will be of the order of 140 MHz. By magneto-resistive effect, this vortex magnetization dynamic is converted into an oscillation of the electrical voltage at the terminals of the junction with a characteristic frequency, called "natural frequency of the junction", which depends on the thickness/diameter ratio (h/ϕ) of the active layer. This dependency of the oscillation frequency on the ratio (h/ϕ) is typical of the vortex mode.

When an alternating signal $I_{RF}$ is injected with a frequency close to the natural frequency of the system (that is to say of the order of the ray width of the resonance signal), there is a modification of the voltage $V_{dc}$ at the terminals of the junction. More directly, the electrical resistance of the junction changes characteristically when the frequency of the injected RF signal is close to the natural frequency of the junction. This voltage (or resistance) variation is the discriminator for detecting the signal and the frequencies of the RF signal.

Different junction structures can be envisaged in the context of the invention.

A first, so-called "1 standard vortex" structure consists of the following stacking: a bottom electrode; SAF; an intermediate layer of MgO; an active layer; a top electrode.

A second, so-called "1 hybrid vortex" structure comprises, for example, a bottom electrode, SAF, an intermediate layer of MgO, an active layer; a few nm of Cu; a perpendicular polarizer formed by a succession of sublayers: for example [Co0.2/Ni0.5]*10; a top electrode.

A third, so-called "2 hybrid vortex" structure is composed of a bottom electrode, SAF; an intermediate layer of MgO; a first active layer; a few nm of Cu; a second active layer; a top electrode.

A fourth, so-called "2 standard vortex" structure is composed of a bottom electrode, a first active layer; an intermediate layer of MgO; a second active layer; a top electrode.

As an illustrative and nonlimiting example, a network of circular junctions with a diameter varying from 50 nm to 1 μm makes it possible to adjust the frequency over a range of approximately 2 GHz to 30 MHz.

The resonance frequency $f_R$ of the junction is also dependent on two other parameters that are the intensity of the direct current circulating through the pillar and the perpendicular component of the magnetic field possibly applied thereto. It is therefore possible to make a very accurate adjustment of the frequency by acting on these two parameters. For example, if a scan of one of these external parameters is carried out, the frequency resolution of the detector can be improved; furthermore, with this scan it is possible to extract an additional item of information: the amplitude of the RF signal. However, such information is obtained at the cost of the loss of the "real time" nature of the detection.

Figure 2:
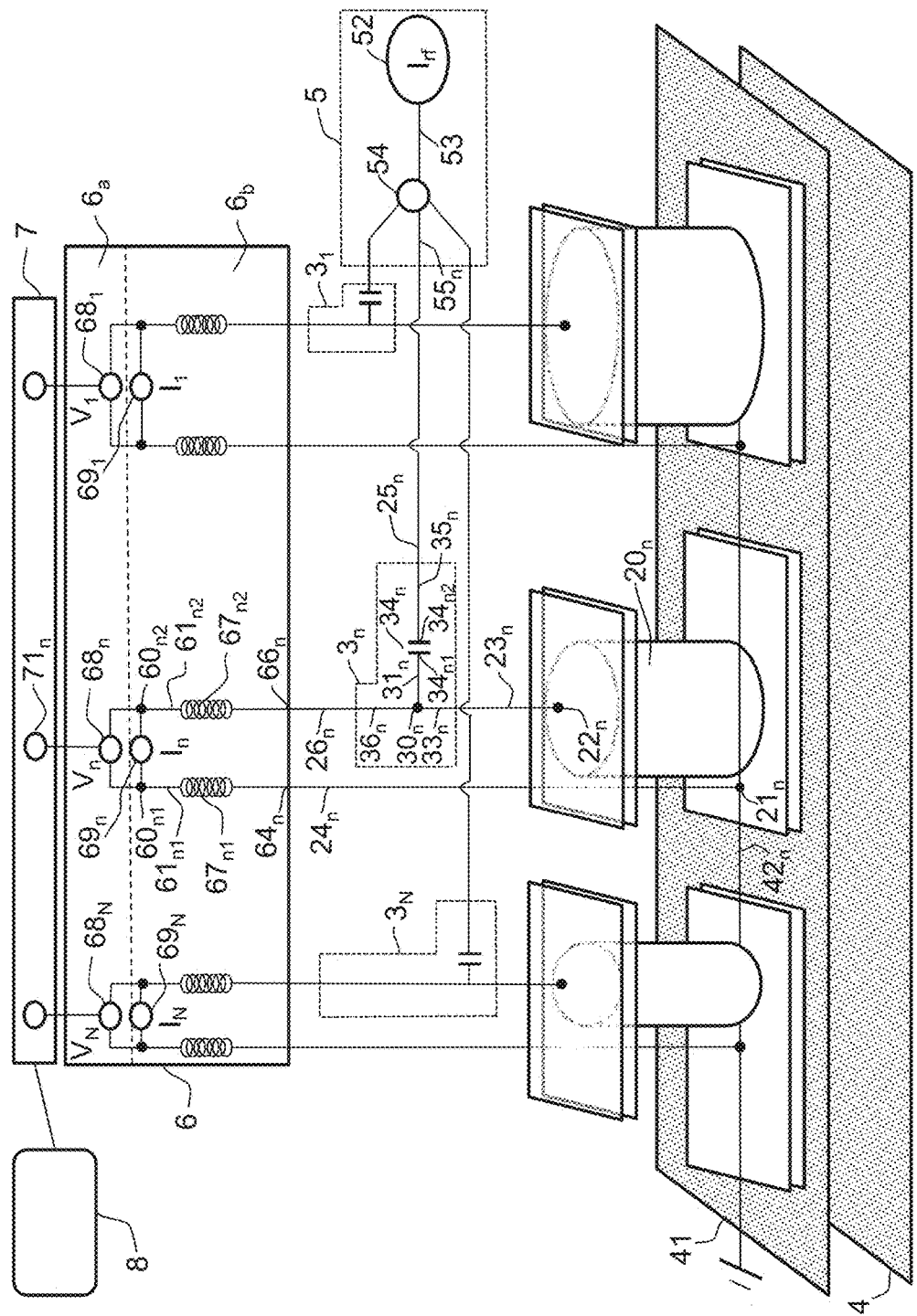
FIG. 2, a first diagram of a device according to the invention for which the elements are arranged in parallel with direct electrical coupling by a transmission line, FIG. 3, a second example of a device for which the elements are arranged in series with direct electrical coupling by transmission line, FIG. 4, a third example for which the elements are excited by magnetic coupling by virtue of an inductive line, and FIG. 5, an exemplary embodiment for the polarization and measurement device.

FIG. 2 illustrates a first example of a device according to the invention. The device comprises N junctions or entities $20_n$ connected in parallel to which a signal to be analyzed $I_{RF}$ by direct electrical coupling is injected. This junction $20_n$ is characterized by a specific structure, for example that described in FIG. 1 or even one of the four structures described previously, with a diameter $\phi_n$ and a thickness $h_n$ of the active layer. With this junction structure is associated a resonance frequency $fr_n$. All the junctions are deposited on a substrate 4.

The bottom electrode $21_n$ of a junction $20_n$ is connected via a transmission line $42_n$ to a ground point 41 common to all the junctions and, via a connection wire $24_n$, to a measurement device 6a adapted for measuring a voltage value. The current which will be distributed at each junction can be of direct or alternating type. The top electrode $22_n$ of the junction $20_n$, is connected via a connection wire $23_n$ to a connection circuit $3_n$ which separates the alternating side (alternating current injection circuit 5 connected via a connection wire $25_n$) from the direct side (measurement device 6a connected via a connection wire $26_n$).

The connection circuit $3_n$ comprises, for example:
- a connection wire $33_n$ which connects a junction point $30_n$, at the node, to the top electrode $22_n$ of the junction $20_n$ via a connection wire $23_n$,
- a connection wire $36_n$ which connects the node $30_n$ to the voltage measurement device 6a via the connection wire $26_n$,
- a connection wire $31_n$ linking the node $30_n$ to a first side $34_{n1}$ of a capacitor $34_n$,
- a connection wire $35_n$ linking the second side $34_{n2}$ of the capacitor $34_n$ to the alternating current injection circuit 5 via the connection wire $25_n$.

In the alternating current injection circuit 5, a main transmission line 53 brings the signal $I_{RF}$ to be analyzed 52 to a "splitter" device, which can be an active or passive element. The "splitter" 54 divides the RF power of the signal to be analyzed, and distributes the signal $I_{RF}$ over N transmission sublines, $55_n$. Each subline $55_n$ is connected to the connection circuit $3_n$ via the connection wire $25_n$ In this way, the signal $I_{RF}$ to be analyzed 52 is injected on each junction $20_n$, via each of the sublines.

The voltage measurement device 6a makes it possible to measure the voltage $V_n$ measured between the bottom electrode and the top electrode of each junction (subcircuit $6_a$). It can also be used to inject a direct current DC (subcircuit $6_b$). This voltage measurement device is connected to the bottom electrode $21_n$ via the connection wire $24_n$ and to the connection circuit $3_n$ via the connection wire $26_n$. Two inductors ($67_{n1}$ and $67_{n2}$) prevent the passage of alternating current in the voltage measurement device 6a.

The subcircuit $6_a$ consists of N measurement devices $68_n$ each adapted for measuring the voltage $V_n$ at the terminals of each junction, for example a voltmeter. The voltage $V_n$ is measured between two nodal points $60_{n1}$ and $60_{n2}$ connected respectively to the bottom electrode and to the top electrode of the junction.

According to a first example, the subcircuit $6_b$ consists of a parallel arrangement of a number of polarization lines $69_n$ each delivering a particular current intensity $I_n$ between the two nodal points $60_{n1}$ and $60_{n2}$, connected respectively to the bottom electrode ($21_n$) and to the top electrode ($22_n$) of the entity $20_n$, and making it possible to vary the frequency that the entities ($20_n$) can detect through the measurement of the value of the voltage $V_n$ between the bottom electrode ($21_n$) and the top electrode ($22_n$). The first node $60_{n1}$ is connected via a first connection wire $61_{n1}$ to a first inductor $67_{n1}$ which is connected to the connection wire $24_n$ via the connection wire $64_n$; the second node $60_{n2}$ is connected via a second connection wire $61_{n2}$ to a second inductor $67_{n2}$ that is connected to the connection wire $26_n$ via the connection wire $66_n$.

Figure 5:
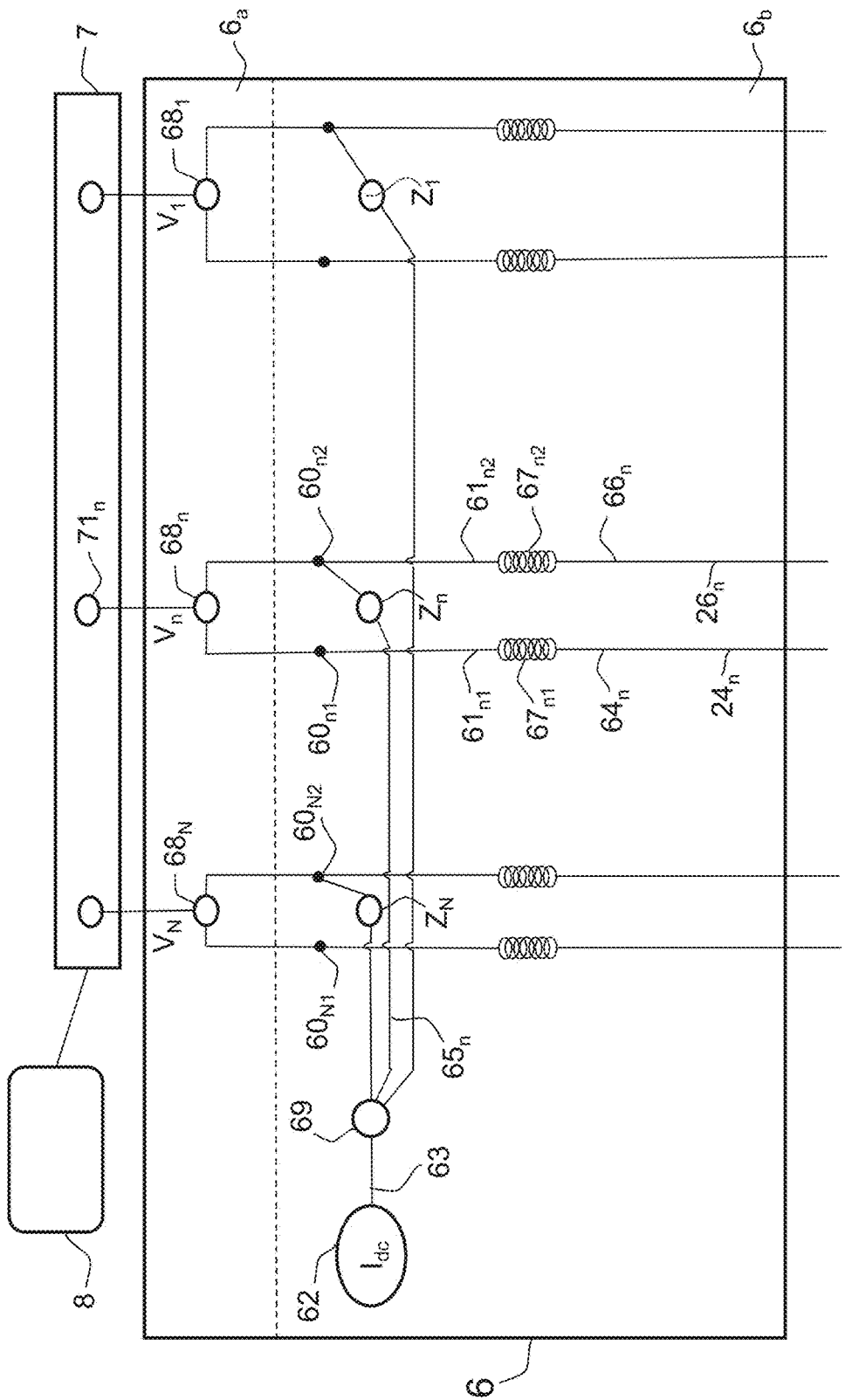

It is also possible to have a single common polarization line and adjust the current $I_n$ individually by the addition of an active or passive element in series between the main polarization line and the junction $20_n$. In this second version of subcircuit $6_b$ (see FIG. 5), a main connection wire 63 brings the current $I_{dc}$ 62 to a division device 69 or "splitter", which can be an active or passive element. The "splitter" 69 divides the current $I_{dc}$ 62 and distributes it over N connection wires $65_n$. Each subline $65_n$ is connected to the node $61_n$ via an element $Z_n$. The element $Z_n$ can be active or passive (diodes, resistor, etc.). The nodes $60_{n1}$ and $60_{n2}$ are connected respectively to the inductors $67_{n1}$ and $67_{n2}$ in the same way as the preceding example.

The voltage measurement subcircuit $6_a$ is itself linked to a value processing device 7. The device 7 can be a comparator of the voltage values measured for each junction relative to one or more reference values, threshold values, in order to determine whether a frequency $f_k$ corresponding to the resonance frequency of the junction $20_n$ is present in the signal currently being analyzed. The presence of a frequency $f_k$ of the analyzed signal $I_{RF}$ can be memorized written and stored in a memory and/or displayed on a screen 8. Another way of proceeding for the device 7 is to use a set of analog/digital converters.

With all working independently and having very small dimensions, within the hundred nanometers range, a massive parallel arranging of these unitary detection entities or junctions makes it possible, within a very small volume, to produce an instantaneous analog spectrum analyzer function for a signal $I_{RF}$. The resonance frequency band of each junction [$f_0-f_0$, $f_0+\Delta f$] is adjusted by acting on the thickness/diameter ratio (h/φ) of the active layer. The diameter $\phi_n$ is, for example, adjusted in order for the resonance frequencies to be juxtaposed and thus create a network for detecting frequencies without holes for analyzing a signal. In this way, it is possible to detect the frequencies present in a signal $I_{RF}$.

The frequency analyzer device according to the invention will act as follows: when a signal $I_{RF}$ to be analyzed containing, for example, three frequencies, $f_1$, $f_2$, $f_3$, is coupled to the device, only the junctions having the structure adapted for resonating on these three frequencies will resonate around $f_1$, $f_2$, $f_3$, so as to simultaneously give the information that the spectrum is occupied around these three frequencies.

In this first example (junctions connected in parallel by direct electrical coupling), the number of sublines $55_n$ is equal to the numbers of junctions. This approach facilitates the control of the impedance matching of the network but to the detriment of sensitivity since the incident power is divided into a number of sublines. It is for example used in the case where the requirement is to detect frequencies with few channels and also of high powers.

Figure 3:
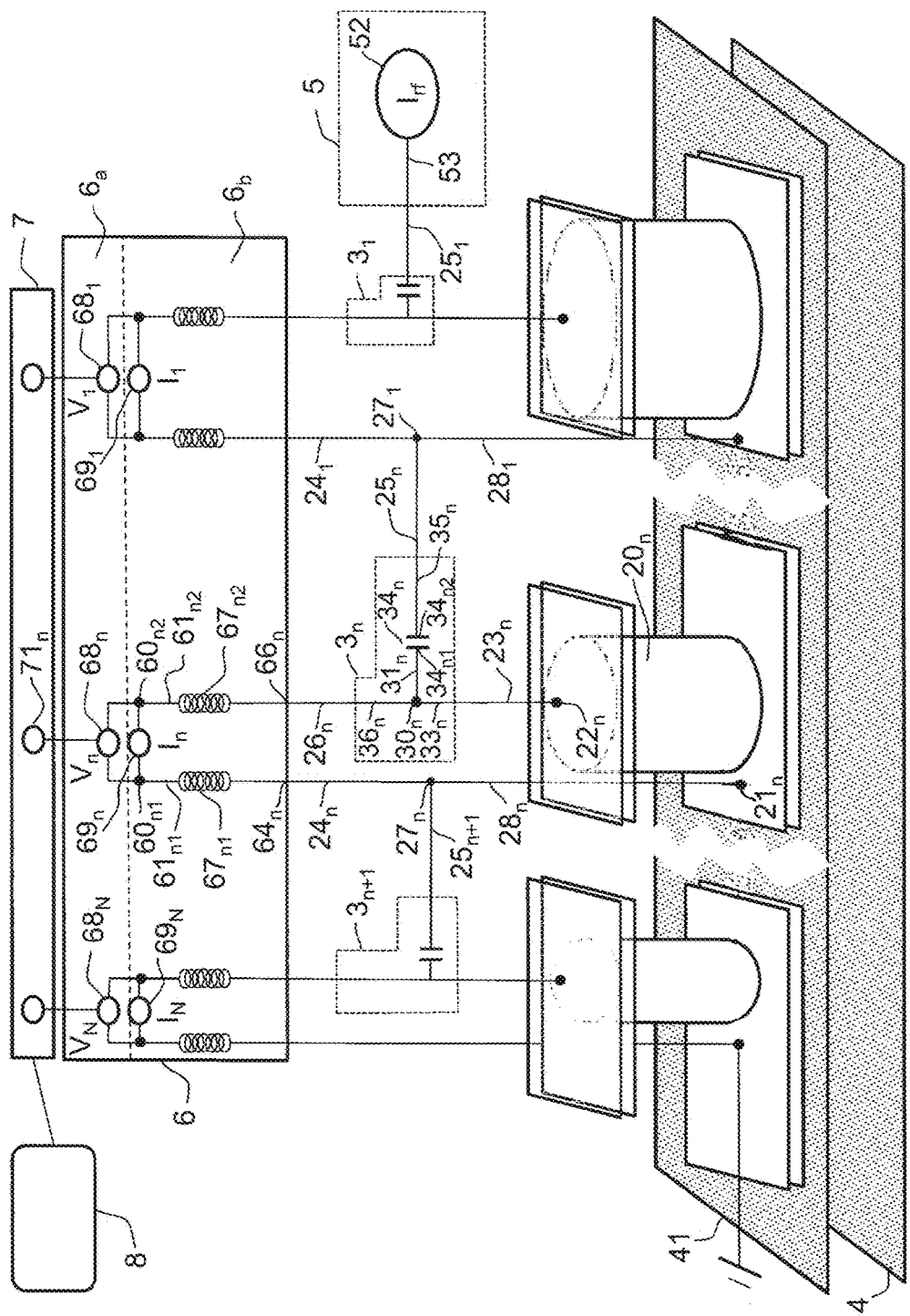

Another way of proceeding is to consider junctions connected in series. FIG. 3 represents a variant embodiment where the entities or junctions are connected in series. This arrangement allows for a relatively good control of the sensitivity to the detriment of the facility to match impedance.

In this variant embodiment, each junction $20_n$ of the network is linked to the connection circuit $3_n$ in a way identical to that described in FIG. 2, that is to say, the top electrode $22_n$ is connected to the connection circuit $3_n$ via the connection wire $23_n$. Similarly, the voltage measurement circuit 6a is connected to the connection circuit $3_n$ via the connection wire $26_n$. However, the top electrode $21_n$ is linked differently as will be described hereinbelow. The aim of this variant embodiment is to connect the junctions in series. The alternating current injection circuit 5 is therefore simplified. A main transmission line 53 brings the signal $I_{RF}$ 52 directly to the connection circuit of the first junction $3_1$ via the connection wire $25_1$. Each junction, in this example, is separated electrically from the other junctions. To obtain a series connection, each junction $20_n$ is connected to the next junction $20_{n+1}$. For each junction, there is a nodal point $27_n$ which makes it possible to link the voltage measurement circuit 6a (via the connection wire $24_n$), the bottom electrode of the pillar $21_n$ (via the connection wire $28_n$), and the connection circuit $3_{n+1}$ of the successive junction $20_{n+1}$ (via the connection wire $25_{n+1}$). In this way, the signal to be analyzed or alternating current $I_{RF}$ is injected in series into the pillar, while a direct current $I_n$ is applied to each pillar and its voltage $V_n$ is measured separately.

Figure 4:
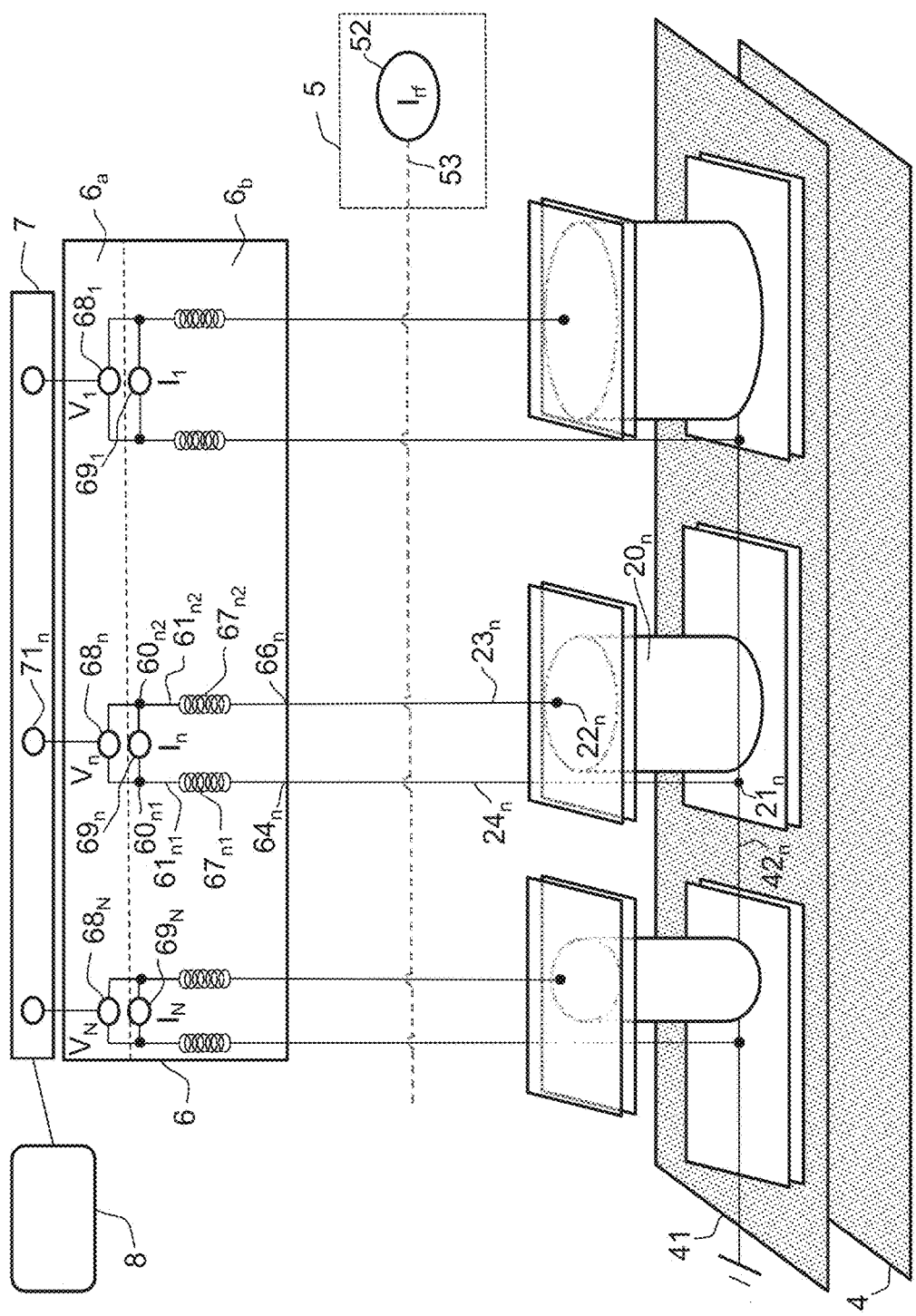

FIG. 4 schematically represents another possible variant embodiment for the device according to the invention. In this case, the signal $I_{RF}$ to be analyzed 52 is routed by a radiating magnetic coupling line 53. The alternating current $I_{RF}$ generates an alternating field which, by inductive coupling, will act on each junction. The amplitude of the alternating signal felt by the junction $20_n$ depends on the distance between the line 53 and the junction itself. The typical values are of the order of a few hundred nanometers. The line can be placed below the junction or to the side depending on the type of junction considered. As in the first embodiment (see FIG. 2), the bottom electrode $21_n$ of a junction $20_n$ is connected via a transmission line $42_n$ to a ground point 41 common to all the junctions and via a connection wire $24_n$ to the voltage measurement device 6a. On the other hand, the top electrode $22_n$ is connected directly to the voltage measurement device 6a via the connection wire $23_n$. The voltage measurement device 6a, and consequently the value processing device 7 and the screen 8 with all their variants, are identical to those described in the first variant embodiment (see FIGS. 2 and 5).

ADVANTAGES

The parallel reading of a network of the magnetic junctions makes it possible to obtain instantaneous information on a range of frequencies present in an incident radiofrequency signal. By virtue of the use of nano objects having the form of a cylindrical magnetic stacking of nanometric size in which the resonance frequencies can be induced to make the detection, the dimensions of the device are extremely reduced.

The invention claimed is:

1. A spectrum analyzer for a signal $I_{RF}$ comprising a number of frequencies $f_i$, comprising:
    N entities, N being non-zero, each consisting of a structure formed by a stacking of magnetic and non-magnetic layers having, in at least one of the magnetic layers, a vortex-form magnetic configuration and at least two of the N entities having a different geometry with an oscillation frequency of an entity being associated with a geometry of the entity, excitation modes of the magnetic configuration being configured to detect in real time frequencies contained in an incident signal, each entity having a bottom first electrode and a top second electrode,
    a voltage measurement device configured to measure an electrical voltage representative of a presence of a frequency $f_k$ in an analyzed signal $I_{RF}$, the voltage measurement device being linked to the bottom first electrode and to the top second electrode of each entity, and
    a measurement processing device configured to determine a value of the frequency $f_k$ present in the signal $I_{RF}$, lines bringing signals to be analyzed from the voltage measurement device, which are connected to each of the entities,
    wherein said entities are arranged in series, a first entity is linked to the voltage measurement device and to an injection circuit via a first connection circuit, the top second electrode is connected to the first connection circuit by a first connection wire, the bottom first electrode is linked to the voltage measurement device by a second connection wire, a transmission line brings the signal $I_{RF}$ to the first connection circuit, a nodal point situated on the second connection wire makes it possible to connect the voltage measurement device to the bottom first electrode and to a second connection circuit of a next entity, the entity being linked to a polarization and the voltage measurement device by means of the second connection circuit at a level of its top second electrode and by a line comprising the nodal point at a level of its bottom first electrode, the nodal point being linked with the second connection circuit of the next entity, and so on to a last entity.

2. The spectrum analyzer as claimed in claim 1, wherein said entities are arranged in parallel, a transmission line bringing the signal to be analyzed $I_{RF}$ to a divider configured for dividing a RF power of the signal to be analyzed and for distributing the signal on N transmission sublines, each subline being connected to a connection circuit linking the top second electrode to the voltage measurement device configured for measuring a voltage $V_n$ the between the bottom first electrode and the top second electrode, the bottom first electrode being linked to a ground point common to all the entities and to the voltage measurement device.

3. The spectrum analyzer as claimed in claim 2, wherein the connection circuit connected to an entity comprises:
    a connection wire connecting a junction point to the top second electrode of said entity via a connection wire,
    a connection wire which connects the junction point to the voltage measurement device via the connection wire,
    a connection wire linking the junction point to a first wall of a capacitor,
    a connection wire linking a second wall of the capacitor to a connection wire bringing the signal to be analyzed.

4. The spectrum analyzer as claimed in claim 1, wherein the first connection circuit comprises:
    a connection wire which connects a junction point to the top second electrode of said entity via a connection wire,
    a connection wire which connects the junction point to the voltage measurement device via the connection wire,
    a connection wire linking the junction point to a first wall of a capacitor,
    a connection wire linking a second wall of the capacitor to a connection wire.

5. The analyzer as claimed in claim 1 wherein the entities are arranged in parallel, the top second electrode being linked to the voltage measurement device configured for measuring the value of a voltage $V_n$ between the bottom first electrode and the top second electrode, the bottom first electrode being linked to a ground point common to all the entities, a radiating magnetic line making it possible to inductively couple to a detector of the signal to be analyzed $I_{RF}$ at each of the entities.

6. The analyzer as claimed in claim 1, wherein the device also consists of N polarization lines configured for injecting a direct current $I_n$ between two nodal points connected respectively to the bottom first electrode and to the top second electrode of the entity and configured for varying a frequency that the entities are capable of detecting through the measurement of the value of a voltage $V_n$ between the bottom first electrode and the top second electrode, a first one of the nodal points is connected via the first connection wire to a first inductor in turn connected to the second connection wire, second one of the nodal points is connected via the second connection wire to a second inductor in turn connected to the first connection wire.

7. The analyzer as claimed in claim 1, wherein the voltage measurement device consists of a current source linked by a main connection to a division device configured for dividing the current and for distributing it over N connection sublines, each subline being connected to a node.

8. The spectrum analyzer as claimed in claim 1, wherein the entities are devices in a form of pillars having a structure chosen from the following list:
- a stacking consisting of: a bottom electrode, a magnetic multilayer of synthetic antiferromagnetic type, a non-magnetic intermediate layer, an active layer containing a magnetic vortex and a top electrode,
- a stacking consisting of: a bottom electrode, a magnetic multilayer of synthetic antiferromagnetic type, a non-magnetic intermediate layer, an active layer containing a magnetic vortex, a second non-magnetic intermediate layer, a perpendicular magnetic polarizer and a top electrode,
- a stacking consisting of: a bottom electrode, a first active layer containing a magnetic vortex, a magnetic intermediate layer, a second active layer containing a vortex and a top electrode, and
- a stacking consisting of: a bottom electrode, a magnetic multilayer of synthetic antiferromagnetic type, a non-magnetic intermediate layer, a first active layer containing a magnetic vortex, a second non-magnetic intermediate layer, a second active layer containing a magnetic vortex and a top electrode.

9. The spectrum analyzer as claimed in claim 1, wherein the voltage measurement device is a voltmeter for measuring a voltage $V_n$ at terminals of each entity and the measurement processing device consists of N comparators of the voltage $V_n$ to a threshold value.

10. The spectrum analyzer as claimed in claim 1, wherein the entity has an ellipsoidal, square or rectangular form.

11. The spectrum analyzer as claimed in claim 1, comprising a number of circular entities or junctions having different diameters variable between 50 nm and 1 μm in order to adjust a frequency over a range of frequencies lying between 30 MHz and 2 GHz.

12. The spectrum analyzer as claimed in claim 1, wherein the entities have a structure configured for producing a magnetic configuration corresponding to a coreless magnetic vortex of C-state type.

\* \* \* \* \*

UNITED STATES PATENT AND TRADEMARK OFFICE
CERTIFICATE OF CORRECTION

PATENT NO.         : 10,408,867 B2
APPLICATION NO.    : 15/101359
DATED              : September 10, 2019
INVENTOR(S)        : Julien Kermorvant et al.

Page 1 of 1

It is certified that error appears in the above-identified patent and that said Letters Patent is hereby corrected as shown below:

In the Claims

In Claim 2, Column 10, Line 18, "a voltage Vn the between the" should be -- a voltage Vn between the --.

Signed and Sealed this
Seventh Day of January, 2020

Andrei Iancu
*Director of the United States Patent and Trademark Office*